(12) United States Patent
Loiferman et al.

(10) Patent No.: US 12,171,056 B2
(45) Date of Patent: Dec. 17, 2024

(54) ELECTRONIC ASSEMBLY AND METHOD FOR THERMAL BALANCING OF SURFACEMOUNT DEVICES

(71) Applicant: Mellanox Technologies Ltd., Yokneam (IL)

(72) Inventors: Igor Loiferman, Yokneam-Illit (IL); Tomer Klein, Pardes Hana-Karkur (IL); Rom Becker, Ramat Yishai (IL)

(73) Assignee: MELLANOX TECHNOLOGIES LTD., Yokneam (IL)

( * ) Notice: Subject to any disclaimer, the term of this patent is extended or adjusted under 35 U.S.C. 154(b) by 233 days.

(21) Appl. No.: 17/844,275

(22) Filed: Jun. 20, 2022

(65) Prior Publication Data
US 2023/0413417 A1 Dec. 21, 2023

(51) Int. Cl.
*H05K 1/02* (2006.01)
*H05K 1/18* (2006.01)
*H05K 3/30* (2006.01)

(52) U.S. Cl.
CPC .......... *H05K 1/0203* (2013.01); *H05K 1/181* (2013.01); *H05K 3/303* (2013.01); *H05K 2201/10015* (2013.01)

(58) Field of Classification Search
CPC .. H05K 7/2039; H05K 7/20454; H05K 7/205; H05K 3/00; H05K 3/303; H05K 3/341; H05K 3/3442; H05K 1/0201–0212; H05K 1/111; H05K 1/181; H05K 2201/06–062; H05K 2201/066–068; H05K 2201/09736; H05K 2201/09781; H05K 2201/10015; H05K 2201/10204; H01L 23/00; H01L 23/373; H01L 23/367; H01L 23/3733; H01L 23/49805; H01L 33/486
See application file for complete search history.

(56) References Cited

U.S. PATENT DOCUMENTS

| | | | | |
|---|---|---|---|---|
| 2006/0186513 | A1* | 8/2006 | Kitaguchi | H05K 3/341 257/E23.079 |
| 2008/0212284 | A1* | 9/2008 | Bertram | H05K 3/0061 361/709 |
| 2010/0238633 | A1* | 9/2010 | Michenfelder | H05K 1/0209 361/717 |
| 2011/0013366 | A1* | 1/2011 | Coppola | H05K 1/0209 361/720 |
| 2012/0273920 | A1* | 11/2012 | Fedorov | H01L 23/38 257/532 |
| 2014/0376190 | A1* | 12/2014 | Dean | H01L 21/4882 361/720 |
| 2015/0260390 | A1* | 9/2015 | Bretschneider | F21V 19/0055 362/373 |
| 2020/0029471 | A1* | 1/2020 | Sugiura | H05K 7/20854 |

(Continued)

*Primary Examiner* — Amir A Jalali
(74) *Attorney, Agent, or Firm* — PEARL COHEN ZEDEK LATZER BARATZ LLP

(57) ABSTRACT

A device may include a printed circuit board (PCB), a plurality of surface-mount devices disposed on the PCB, wherein a thermal mass of each of the surface-mount devices ranges between a first thermal mass value and a second thermal mass value that is greater than the first thermal mass value, and a plurality of thermal capacitors disposed on the PCB, wherein a thermal mass of each of the thermal capacitors is equal to or greater than the first thermal mass value of the surface-mount devices.

18 Claims, 2 Drawing Sheets

(56) References Cited

U.S. PATENT DOCUMENTS

| | | | |
|---|---|---|---|
| 2022/0408545 A1* | 12/2022 | Haraguchi | H05K 7/20 |
| 2023/0083132 A1* | 3/2023 | Zhang | H05K 1/181 |
| | | | 361/710 |
| 2023/0110020 A1* | 4/2023 | Graham | H05K 7/2039 |
| | | | 174/252 |

* cited by examiner

ELECTRONIC ASSEMBLY AND METHOD FOR THERMAL BALANCING OF SURFACEMOUNT DEVICES

FIELD OF THE INVENTION

The present invention relates to the field of surface-mount technology, and more particularly, to thermal balancing of an electronic assembly during surface-mount process of surface-mount devices.

BACKGROUND OF THE INVENTION

Surface-mount technology (SMT) is a process in which surface-mount devices are mounted onto the surface of a printed circuit board (PCB). The SMT process typically includes applying a solder material or paste on the PCB surface, positioning the surface-mount devices on the PCB surface and controllably heating the entire assembly in a dedicated reflow oven device. During the heating stage of the process, a surface-mount device having higher thermal mass than other surface-mount devices on the PCB, e.g. due to dimensions, thermal capacitance and/or density of that surface-mount device, may absorb more heat than other surface-mount devices placed or disposed on the PCB thus lowering the temperature of the assembly in a vicinity of that surface-mount device. The surface-mount device having greater thermal mass than other surface-mount devices on the PCB is also referred herein as a "heat sinking surface-mount device". Lowering the temperature below or to be too close to the molting temperature of the solder paste in the vicinity of the heat sinking surface-mount device may reduce the quality of soldering of other surface-mount devices in that region. Typically, in order to keep the temperature in the vicinity of the heat sinking surface-mount device above the desired temperature value, the temperature in the entire reflow oven device is increased. However, increasing the temperature in the entire reflow oven device may increase the temperature of the assembly in regions that are relatively distant from the heat sinking surface-mount device above the maximal allowable temperature value and/or create temperature gradients across the surface of the assembly that are above the maximal allowable temperature gradient value. Temperatures that exceed the maximal allowable temperature value and temperature gradients that exceed the maximal allowable temperature gradient value may damage or otherwise reduce the quality of the assembly.

SUMMARY OF THE INVENTION

Embodiments of the present invention may provide an electronic assembly or a device which may include a printed circuit board (PCB), a plurality of surface-mount devices disposed on the PCB, and one or a plurality of thermal capacitors (e.g. heat absorbing components) disposed on the PCB. A thermal mass of each of the surface-mount devices may range between a first (e.g. minimal) thermal mass value and a second (e.g. maximal) thermal mass value that is greater than the first thermal mass value. A thermal mass of each of the thermal capacitors may be equal to or greater than the first (e.g. minimal) thermal mass value of the surface-mount devices and/or equal to or smaller than the second (e.g. maximal) thermal mass value of the surface-mount devices. The electronic assembly may include a solder paste (e.g. solder material) disposed between (i) a surface of the PCB and (ii) the surface-mount devices and the thermal capacitors. At least a portion of the thermal capacitors may be disposed between the surface-mount devices and edges of the PCB. The electronic assembly may include a first region including a plurality of components having a first total thermal mass and a second region including a plurality of components having a second total thermal mass that is greater than the first total thermal mass, wherein at least a portion of the thermal capacitors may be disposed in the second region. More than one such region defined by differing thermal mass components may be used. At least a portion of the thermal capacitors may be disposed along edges of the PCB. At least a portion of the thermal capacitors may be disposed in between the surface-mount devices. The PCB may include a plurality of structural components to dispose the thermal capacitors on the PCB and/or to thermally couple the thermal capacitors to the PCB. The structural components may include at least one of plated holes, pads, via holes or stitching areas of the PCB. The thermal capacitors may be removable from the PCB. The thermal capacitors are unremovable from the PCB.

BRIEF DESCRIPTION OF THE DRAWINGS

For a better understanding of embodiments of the invention and to show how the same can be carried into effect, reference will now be made, purely by way of example, to the accompanying drawings in which like numerals designate corresponding elements or sections throughout.

In the accompanying drawings.

Figure 1A:
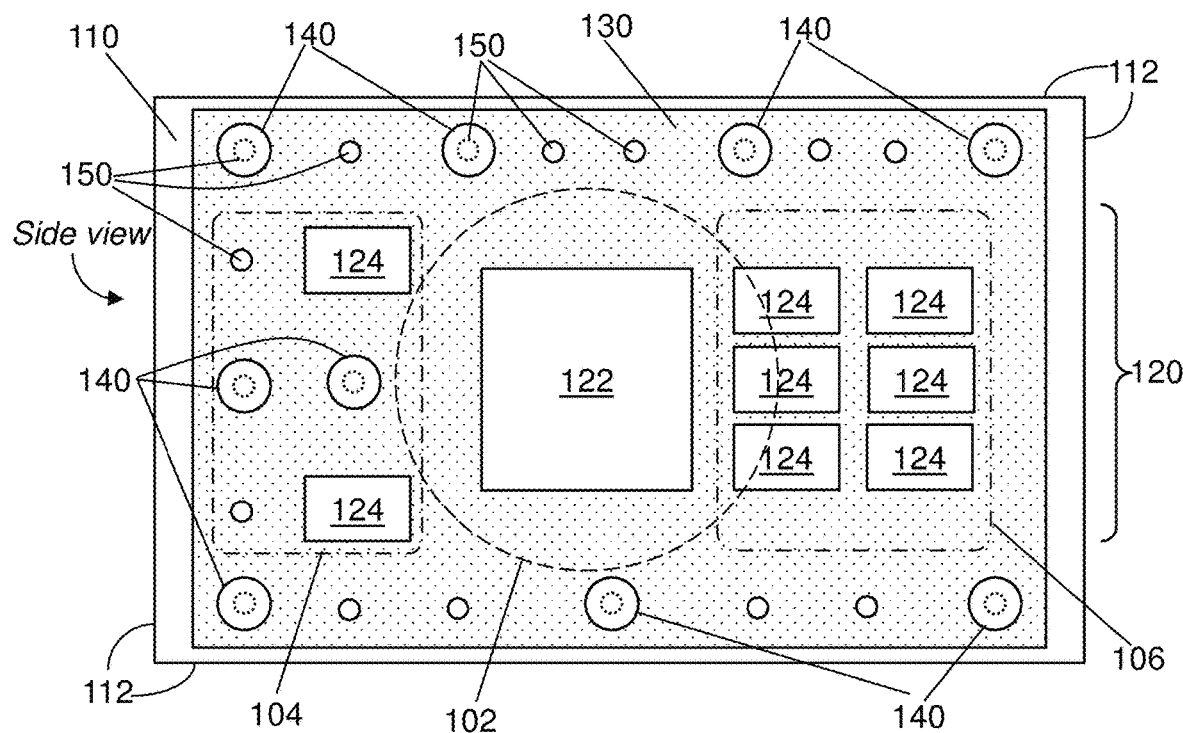
FIGS. 1A and 1B are schematic illustrations of an electronic assembly for thermal balancing of surface-mount devices during surface-mount process, according to some embodiments of the invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features can have been omitted or simplified in order not to obscure the present invention. With specific reference to the drawings, it is stressed that the particulars shown are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Figure 1B:
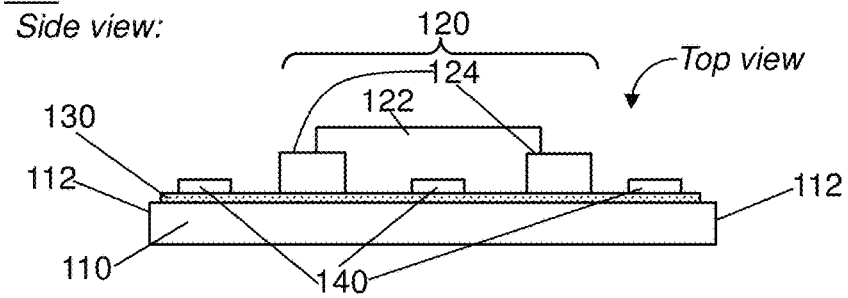

Reference is now made to FIGS. 1A and 1B, which are schematic illustrations of an electronic assembly 100 for thermal balancing of surface-mount or electronic devices 120 during surface-mount process, according to some embodiments of the invention.

FIG. 1A shows a schematic top view of electronic assembly 100. FIG. 1B shows a schematic side view (as indicated in FIG. 1A) of electronic assembly 100.

Electronic assembly or electronic device 100 may include a printed circuit board (PCB) 110 and a plurality of surface-mount devices 120 disposed on the surface of PCB 110. Electronic assembly 100 may include solder material or solder paste 130 or other material applied on the surface of PCB 110 and disposed between PCB 110 and surface-mount devices 120. Surface-mount devices 120 may be connected to PCB 110 in a surface-mount process which may include inserting electronic assembly 100 into a dedicated reflow oven device, or other system, to heat and melt solder paste 130 to connect surface-mount devices 120 to PCB 110.

One (or more) of surface-mount devices 120, e.g. a surface-mount device 122, may have a thermal mass that is higher (e.g. significantly higher) than thermal masses of each of other surface-mount devices 124 on PCB 110, e.g. due to greater dimensions, higher thermal capacitance and/or higher density of surface-mount device 122 as compared to other surface-mount devices 124. The thermal mass of an object (e.g. surface-mount device) may be expressed by the thermal capacitance (e.g. heat capacity), the density and the volume of the respective object. For example, the thermal mass of an object may be expressed by Equation 1:

$$M_{th} = C_{th} \cdot \rho \cdot V = \left(\frac{Q}{\Delta T \cdot M}\right) \cdot \rho \cdot V \quad \text{(Equation 1)}$$

wherein $M_{th}$ [J/° K.] is the thermal mass of the object, $C_{th}$ [J/kg·° K.] is the thermal capacitance (e.g. heat capacity) of the object, $\rho$ [kg/m³] is the density of the object and V [m³] is the volume of the object, wherein the thermal capacitance (e.g. heat capacity) $C_{th}$ of the object may be expressed by the amount of energy Q [J] to be added to the object of mass M [kg] to change the temperature of the object by $\Delta T$ [° K.]. The thermal mass of the object may indicate the amount of energy needed to change the temperature of the object by a degree of Kelvin (° K.).

The thermal mass of surface-mount device 122 may be higher by, for example, at least 1000% than the thermal mass of each of surface-mount devices 124. Accordingly, when electronic assembly 100 is heated during the surface-mount process, surface-mount device 122 may absorb more heat (e.g. significantly more heat) as compared to other surface-mount devices 124 on PCB 110 thus lowering the temperature of electronic assembly 100 in a vicinity of surface-mount device 122, e.g. in a region 102 surrounding surface-mount device 122. Surface-mount device 122 is also referred herein as "heat sinking surface-mount device 122". One example of heat sinking surface-mount device 122 may include an application specific integrated circuit (ASIC) device, such as field-programmable gate array (FGPA), graphics processing unit (GPU), central processing unit (CPU) or any other component known in the art. Lowering the temperature of electronic assembly 100 in region 102 around heat sinking surface-mount device 122, e.g. below or too close to the melting temperature of solder paste 130, may reduce the quality of soldering of surface-mount devices 124 in region 102. In order to keep the temperature of electronic assembly 100 in region 102 above the desired temperature value (e.g. above 260° C.), the temperature in the entire reflow oven device may be increased. However, increasing the temperature in the entire reflow oven device may increase the temperature of electronic assembly 100 in regions that are relatively distant from heat sinking surface-mount device 122 (e.g. regions that are external to region 102) above the maximal allowable temperature value (e.g. above 260° C.) which may damage components (e.g. surface-mount devices 124) of electronic assembly 100 in those regions or otherwise reduce the quality of electronic assembly 100. In some cases, increasing the temperature in the entire reflow oven device may create temperature gradients across different regions of electronic assembly 100 that are above the maximal allowable temperature gradient value (e.g. above 10° C.) which may also damage components of electronic assembly 100 or otherwise reduce the quality of electronic assembly 100.

In order to balance the temperature of electronic assembly 100 or at least reduce the temperature differences across the surface of electronic assembly 100 to minimum (e.g. below during the heating stage of the surface-mount process, in embodiments of the present invention electronic assembly 100 may include a plurality of thermal capacitors (e.g. heat absorbing components) 140. Thermal capacitors 140 may be placed or disposed on the surface of PCB 110. Thermal capacitors 140 may be disposed on PCB 110 before electronic assembly 100 is inserted into the reflow oven device.

Thermal capacitors 140 may be made of materials having high thermal capacitance (e.g. high heat capacity). For example, each of thermal capacitors 140 may be a piece of metal such as copper, aluminum or any other material known in the art. Each of surface-mount devices 120 on PCB 110 may have a thermal mass that ranges between a first (e.g. minimal) thermal mass value and a second (e.g. maximal) thermal mass value that is greater than the first thermal mass value. For example, heat sinking surface-mount device 122 may have the second (e.g. maximal) thermal mass value among surface-mount devices 120 and one (or more) of other surface-mount devices 124 may have the first (e.g. minimal) thermal mass value among surface-mount devices 120. Each of thermal capacitors 140 may have a thermal mass that is equal to or greater than the first (e.g. minimal) thermal mass value of surface-mount devices 120. Each of thermal capacitors 140 may have a thermal mass that is equal to or smaller than the second (e.g. maximal) thermal mass value of surface-mount devices 120. Each of thermal capacitors 140 may change its interior temperature uniformly (or substantially uniformly) across its volume while the thermal capacitor heats over time. For example, each of thermal capacitors 140 may have a Biot number (Bi) that is smaller than 10. The Biot number of an object may be, for example, expressed by a ratio of a convective heat transfer coefficient of the object over a thermal conductivity of the object, times a characteristic length of the object. Thermal capacitors 140 may have circular, square, rectangular or any other shape known in the art.

Thermal capacitors 140 may be disposed on PCB 110 in a region between heat sinking surface-mount device 122 and borders or edges 112 of PCB 110. The number and positions of thermal capacitors 140 on PCB 110 may be predefined based on, for example, positions and thermal masses of surface-mount devices 120 (e.g. heat sinking surface-mount device 122 and other surface-mount devices 124) and other components of electronic assembly 100 and/or based on design constraints or considerations of electronic assembly 100 (e.g. maximal picking force of SMT device, potential interference of thermal capacitors 140 with other components on PCB 110, desired or sufficient heat transfer between PCB 110 and thermal capacitors 140, etc.). The number and positions of thermal capacitors 140 on PCB 110 may be predefined to balance the temperature of electronic assembly 100 or at least reduce the temperature differences across the surface of electronic assembly 100 to minimum (e.g. below 10° C.) during the heating stage of the surface-mount process. At least a portion of thermal capacitors 140 may be disposed, for example, around heat sinking surface-mount device 122. At least a portion of thermal capacitors 140 may be disposed, for example, adjacent to (e.g. along) edges 112 of PCB 110. At least a portion of thermal capacitors 140 may be disposed, for example, in between surface-mount devices 120 (e.g. between heat sinking surface-mount device 122 and other surface-mount devices 124 and/or in between surface-mount devices 124). At least a portion of thermal capacitors 140 may be disposed, for example, in regions including components having relatively low total thermal mass as compared to other regions of electronic assembly 100. Such regions may, for example, include relatively least densely populated regions of electronic assembly 100 (e.g. regions with relatively small number of surface-mount devices 120 or other components) and/or densely populated regions of electronic assembly 100 having surface-mount devices 120 or other components with relatively small thermal mass. For example, among two regions 104, 106 of electronic device 100 schematically indicated in FIG. 1A by dashed rectangles, region 104 may have smaller thermal mass than region 106 because region 104 includes less surface-mount devices 120 and/or because the total thermal mass of surface-mount devices 124 in region 104 is smaller than the total thermal mass of surface-mount devices 124 in region 106. In this example, region 104 may include a portion of thermal capacitors 140 to balance the temperature of region 104 as compared to other regions of electronic assembly 100 during the heating stage of surface-mount process.

PCB 110 may include a plurality of structural components 150 to dispose thermal capacitors 140 on PCB 110 and/or to thermally couple thermal capacitors 140 to PCB 110. Structural components 150 may, for example, include plated holes, pads (e.g. exposed regions of metal on PCB 110), via holes (e.g. via-in-pad plated over (VIPPO) holes), stitching areas of PCB 110 or any other structural components known in the art. Each of thermal capacitors 140 may be disposed on or at least partly disposed in one of structural components 150. Structural components 150 such as holes, pads, via holes and stitching areas typically exist on any PCB and are not dedicated or specific for disposing and/or thermal coupling of thermal capacitors 140 to PCB 110. Utilizing existing structural features 150 for disposing and/or thermal coupling of thermal capacitors 140 to PCB 110 may eliminate a need in dedicated connectors or other modification of PCB 110 and may simplify the process of disposing thermal capacitors 140 on PCB 110.

The heating stage of the surface-mount process is typically performed according to a heating profile (e.g. predefined heating profile) that may, for example, include a ramp to soak substage, a preheat/soak substage, a ramp to peak substage, a reflow substage and a cooling substage. In order to process electronic assembly 100 with thermal capacitors 140, in some embodiments, the heating profile may need to be changed as compared to when no thermal capacitors are used. For example, the duration and/or the temperature (e.g. the setpoint temperature) of one or more of the substages may be changed when heating electronic assembly 100 with thermal capacitors 140 as compared to when no thermal capacitors are used. The changes made to the heating profile may be based on, for example, the number, positions and/or thermal masses of thermal capacitors 140 used in electronic assembly 100 and/or other components of electronic assembly 100. The heating profile may be changed to, for example, ensure that the temperature of electronic assembly 100 is above the desired temperature value (e.g. above 260° C. or above 245° C. in regions with temperature sensitive components) and that the temperature gradients across different regions of electronic assembly 100 are below the maximal allowable temperature gradient value (e.g. below 10° C.).

Thermal capacitors 140 may be, for example, removed from PCB 110 after the surface-mount process is complete. In another example, thermal capacitors 140 may be connected to PCB 110 during the surface-mount process and may remain part of electronic assembly 110.

Figure 2:
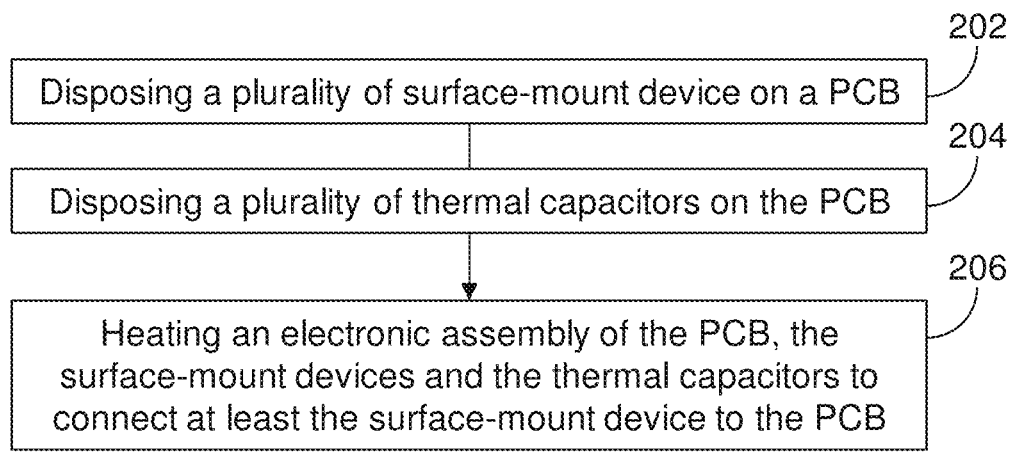
FIG. 2 is a flowchart of a method of thermal balancing of surface-mount devices of an electronic assembly during surface-mount process, according to some embodiments of the invention.

Reference is now made to FIG. 2, which is a flowchart of a method of thermal balancing of surface-mount devices of an electronic assembly during surface-mount process, according to some embodiments of the invention. The operations of FIG. 2 may be performed with the equipment shown in FIG. 1 but may be performed with other equipment.

In operation 202, a plurality of surface-mount or electronic devices may be disposed on a printed circuit board (PCB). For example, the surface-mount devices may be surface-mount devices 120 and may include heat sinking surface-mount device 122 and other surface-mount devices 124; and PCB may be PCB 110; as described above with respect to FIGS. 1A-1B.

In operation 204, one or more or a plurality of thermal capacitors may be placed or disposed on the PCB. For example, the thermal capacitors may be thermal capacitors 140 described above with respect to FIGS. 1A-1B. In operation 206, an electronic assembly of the PCB, the surface-mount devices and the thermal capacitors may be heated to connect at least the surface-mount device to the PCB. The electronic assembly may be heated as part of the surface-mount process in the reflow over device or other system (e.g. as described above with respect to FIGS. 1A-1B).

The thermal capacitors may balance or even out the temperature of the electronic assembly across different areas or at least reduce the temperature differences across the surface of the electronic assembly to minimum (e.g. below 10° C.) during the heating stage of the surface-mount process (e.g. as described above with respect to FIGS. 1A-1B). The thermal capacitors may be disposed in regions that include components having relatively low total thermal mass as compared to other regions of the electronic assembly (e.g. as described above with respect to FIGS. 1A-1B).

Such regions may, for example, include relatively least densely populated regions of the electronic assembly (e.g. regions with relatively small number of surface-mount devices or other components) and/or densely populated regions of the electronic assembly having surface-mount devices or other components with relatively small total thermal mass (e.g. as described above with respect to FIGS. 1A-1B).

The thermal capacitors may be disposed on structural components of the PCB. The structural components may, for example, include plated holes, pads, via holes, stitching areas of the PCB or any other structural components known in the art (e.g. as described above with respect to FIGS. 1A-1B). The structural components may thermally couple the thermal capacitors to the PCB (e.g. as described above with respect to FIGS. 1A-1B).

The thermal capacitors may be, for example, removed from the PCB after the surface-mount process is complete (e.g. as described above with respect to FIGS. 1A-1B). In another example, the thermal capacitors may be connected to the PCB during the surface-mount process and may remain part of the electronic assembly (e.g. as described above with respect to FIGS. 1A-1B).

Embodiments of the present invention may improve thermal balancing of the electronic assembly (e.g. electronic assembly 100 described above with respect to FIGS. 1A-1B) by disposing a plurality of thermal capacitors (e.g. thermal capacitors 140 described above with respect to FIGS. 1A-1B) on the PCB of the electronic assembly before inserting the electronic assembly into the reflow over device as part of the surface-mount process. During heating of the electronic assembly in the reflow oven device, the thermal capacitors may balance the temperature of the electronic assembly or at least reduce the temperature differences over the surface of the electronic assembly to minimum (e.g. below 10° C.) thus ensuring proper soldering of the surface-mount devices to the PCB and preventing thermal-related or other damage of the electronic assembly (e.g. as described above with respect to FIGS. 1A-1B). The thermal capacitors may be disposed on and/or thermally coupled to the PCB using existing structural components such as, for example plated holes, pads, via holes or stitching areas of the PCB (e.g. structural components 150 described above with respect to FIGS. 1A-1B), thus eliminating a need in modification of the PCB and ensuring simple process of disposing the thermal capacitors on the PCB. Due to the improved thermal balancing of the electronic assembly achieved by the thermal capacitors disposed on the PCB of the electronic assembly (e.g. as described herein), embodiments of the present invention may enable or simplify surface-mount process of temperature-sensitive surface-mount devices (e.g. such as Double Data Rate (DDR) memory devices, Fine-Pitch Ball Grid Array (FBGA) devices, Quad-Flat No-Leads (QFN) devices or any other temperature-sensitive surface-mount devices known in the art). Utilization of such temperature-sensitive surface-mount devices in prior art non-balanced electronic assemblies (e.g. electronic assemblies without thermal capacitors) in some cases is not possible or complex.

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination. Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

Although embodiments of the invention are not limited in this regard, the terms "plurality" and "a plurality" as used herein can include, for example, "multiple" or "two or more". The terms "plurality" or "a plurality" can be used throughout the specification to describe two or more components, devices, elements, units, parameters, or the like. The term set when used herein can include one or more items.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A device comprising:
a printed circuit board (PCB); a plurality of surface-mount electronic devices disposed on the PCB, wherein a thermal mass of each of the surface-mount electronic devices ranges between a first thermal mass value and a second thermal mass value that is greater than the first thermal mass value; and
a plurality of thermal capacitors disposed on the PCB, wherein a thermal mass of each of the thermal capacitors is equal to or greater than the first thermal mass value and equal to or smaller than the second thermal mass value.

2. The device of claim 1, comprising a solder paste disposed between (i) a surface of the PCB and (ii) the surface-mount electronic devices and the thermal capacitors.

3. The device of claim 1, wherein at least a portion of the thermal capacitors are disposed between the surface-mount electronic devices and edges of the PCB.

4. The device of claim 1, comprising: a first region comprising a plurality of surface-mount electronic devices having a first total thermal mass; and a second region comprising a plurality of surface-mount electronic devices having a second total thermal mass that is greater than the first total thermal mass; wherein at least a portion of the thermal capacitors are disposed in the second region.

5. The device of claim 1, wherein at least a portion of the plurality of thermal capacitors are disposed along edges of the PCB.

6. The device of claim 1, wherein at least a portion of the thermal capacitors are disposed in between the surface-mount electronic devices.

7. The device of claim 1, wherein the PCB comprising a plurality of structural components to dispose the plurality of thermal capacitors on the PCB.

8. The device of claim 1, wherein the PCB comprising a plurality of structural components to thermally couple the plurality of thermal capacitors to the PCB.

9. The device of claim 7, wherein the structural components comprising at least one of plated holes, pads, via holes or stitching areas of the PCB.

10. The device of claim 1, wherein the plurality of thermal capacitors are removable from the PCB.

11. The device of claim 1, wherein the plurality of thermal capacitors are unremovable from the PCB.

12. An electronic assembly comprising:
a printed circuit board (PCB);
a plurality of electronic devices disposed on the PCB;
one or more heat absorbing components disposed on the PCB; and
a solder material disposed between (i) a surface of the PCB and (ii) the electronic devices and the heat absorbing components,
wherein a thermal mass of each of the electronic devices ranges between a first thermal mass value and a second thermal mass value that is greater than the first thermal mass value, and
wherein each of the heat absorbing components has a thermal mass that is (i) equal to or greater than the first thermal mass value of the electronic devices and (ii) equal to or smaller than the second thermal mass value of the electronic devices.

13. The assembly of claim 12, comprising: a first region comprising a plurality of electronic devices having a first total thermal mass; and a second region comprising a plurality of electronic devices having a second total thermal mass that is greater than the first total thermal mass; wherein at least a portion of the one or more heat absorbing components are disposed in the first region.

14. The assembly of claim 12, wherein the PCB comprising a plurality of structural components to dispose the one or more heat absorbing components on the PCB or thermally couple the one or more heat absorbing components to the PCB.

15. A method comprising:
disposing a plurality of surface-mount electronic devices on a printed circuit board (PCB), wherein a thermal mass of each of the surface-mount electronic devices ranges between a first thermal mass value and a second thermal mass value that is greater than the first thermal mass value;
disposing a plurality of thermal capacitors on the PCB, wherein a thermal mass of each of the thermal capacitors is equal to or greater than the first thermal mass value and equal to or smaller than the second thermal mass value; and
heating an electronic assembly of the PCB, the surface-mount electronic devices and the thermal capacitors to connect at least the surface-mount electronic devices to the PCB.

16. The method of claim 15, wherein disposing the plurality of thermal capacitors on the PCB comprising thermally coupling the thermal capacitors to the PCB.

17. The method of claim 15, comprising disposing a solder paste between (i) a surface of the PCB and (ii) the surface-mount devices and the thermal capacitors.

18. The method of claim 15, comprising disposing at least a portion of the thermal capacitors in a first region of the electronic assembly, wherein the first region comprising a plurality of surface-mount electronic devices having a first total thermal mass that is smaller than a second total thermal mass of a plurality of surface-mount electronic devices disposed in a second region of the electronic assembly.

* * * * *